(12) United States Patent
Hayashi et al.

(10) Patent No.: US 6,444,549 B2
(45) Date of Patent: *Sep. 3, 2002

(54) THERMAL PROCESSING OF SEMICONDUCTOR DEVICES

(75) Inventors: Toshiya Hayashi; Kouji Hamada; Naoharu Nishio; Kousuke Miyoshi; Shuichi Saito, all of Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,938

(22) Filed: Sep. 1, 1998

(30) Foreign Application Priority Data

Sep. 12, 1997 (JP) ................................ 9-248880

(51) Int. Cl.[7] .................. H01L 21/425; H01L 21/331
(52) U.S. Cl. ........................ 438/530; 438/370
(58) Field of Search ............... 438/530, 499, 438/301, 369, 370, 795

(56) References Cited

U.S. PATENT DOCUMENTS

| 4,432,809 | A | * | 2/1984 | Chye et al. | 438/795 |
|---|---|---|---|---|---|
| 4,482,393 | A | * | 11/1984 | Nishiyama et al. | 148/1.5 |
| 4,522,657 | A | | 6/1985 | Rohatgi et al. | 148/1.5 |
| 4,732,866 | A | * | 3/1988 | Chruma et al. | 438/530 |
| 4,743,569 | A | * | 5/1988 | Plumton et al. | 438/522 |
| 4,753,895 | A | * | 6/1988 | Mayer et al. | 438/154 |
| 4,784,964 | A | * | 11/1988 | Hulseweh et al. | 438/499 |
| 4,912,053 | A | * | 3/1990 | Schrantz | 438/188 |
| 5,130,261 | A | | 7/1992 | Usuki et al. | 438/530 |
| 5,312,764 | A | * | 5/1994 | Drowley et al. | 438/499 |
| 5,399,506 | A | * | 3/1995 | Tsukamoto | 438/301 |
| 5,476,799 | A | * | 12/1995 | Sakamoto et al. | 438/530 |
| 5,487,127 | A | | 1/1996 | Gronet et al. | |
| 5,612,253 | A | * | 3/1997 | Farahani et al. | 438/643 |
| 5,773,337 | A | * | 6/1998 | Lee | 438/199 |
| 5,834,353 | A | * | 11/1998 | Wu | 438/287 |
| 5,872,047 | A | * | 2/1999 | Lee et al. | 438/530 |
| 5,940,699 | A | * | 8/1999 | Sumi et al. | 438/233 |
| 5,950,078 | A | * | 9/1999 | Maekawa et al. | 438/149 |
| 5,967,794 | A | * | 10/1999 | Kodama | 438/300 |

FOREIGN PATENT DOCUMENTS

| JP | 59-108315 | * | 6/1984 | ........ 438/FOR 325 |
|---|---|---|---|---|
| JP | 4-249315 | | 9/1992 | ......... H01L/21/265 |
| JP | 7-74180 | | 3/1995 | ......... H01L/21/324 |
| JP | 8-107067 | | 4/1996 | ........... H01L/21/20 |
| JP | 9-148570 | | 6/1997 | ........... H01L/28/79 |
| JP | 10-55978 | | 2/1998 | ......... H01L/21/265 |

OTHER PUBLICATIONS

Shishiguchi et al., 1997 Symposium on VLSI Technology Digest of Technical Papers, pp. 89–90, 1997.*
Liu et al., Solid–State Electronics 38(8), 1995, pp. 1473–1477, 1995.*

(List continued on next page.)

Primary Examiner—Howard Weiss
Assistant Examiner—Marcos D. Pizarro-Crespo
(74) Attorney, Agent, or Firm—Hayes & Soloway P.C.

(57) ABSTRACT

Upon fabrication of semiconductor devices, a semiconductor substrate is subjected to ion implantation with high energy. Subsequent annealing of the ion-implanted semiconductor substrate, when conducted by heating the substrate to a temperature of from 1,000° C. to 1,200° C. at a ramp-up rate of at least 200° C./sec, makes it possible to provide the resulting semiconductor devices with smaller leakage currents of reduced variations ($\sigma/X$). The present invention can therefore provide a process for the fabrication of semiconductor devices featuring both smaller leakage currents and reduced variations of the leakage currents even when ion implantation is conducted with high energy.

5 Claims, 8 Drawing Sheets

OTHER PUBLICATIONS

Foad et al., IEEE 0–7803–4538–X/99, pp. 732–735, 1999.*
Downey et al., IEEE 0–7803–4538–X/99, pp. 55–58, 1999.*
Kang et al., IEEE Electron device Letters 21(1), 2000, pp. 9–11.*
Jang et al., IEEE TENCON 0–7803–5739–6/99, pp. 1121–1123, 1999.*

Hamada, K., Nishio N., and Saito, S., "Anomalous Leakage Current Reduction by Ramping Rate Control in MeV Implantation", Mat. Res. Soc. Symp. vol. 396, 1996.*
"Anomalous Leakage Current Reduction by Ramping Rate Control in MEV Implnatation" Mat. Res. Soc. Symp. Prac. vol. 396; 1996 Materials Research Society; p. 739–743.

* cited by examiner

THERMAL PROCESSING OF SEMICONDUCTOR DEVICES

BACKGROUND OF THE INVENTION

1. Field of the Invention

This invention relates to a fabrication process of semiconductor devices, and especially to a fabrication process of semiconductor devices suitable for use in bipolar transistors or biCMOS transistors.

2. Description of the Prior Art

With a view to reducing fabrication costs and shortening TAT (Turn Around Time; time from the acceptance of an order until its delivery), high-energy ion implantation (which means ion implantation with an acceleration voltage of several hundreds kev or higher) has been attempted as a substitute for the conventional epitaxial growth in recent years for the formation of buried collector layers for bipolar or biCMOS transistors.

Because of the need for a reduction in collector resistance to permit operation of a device at a higher speed, a dopant dose higher than that ($<5 \times 10^{13}$ cm$^{-2}$) employed to date for the formation of wells and the like is required upon high-energy ion implantation. However, use of a dose of about $1 \times 10^{14}$ cm$^{-2}$ or so is desired in view of the maintenance of an adequate balance between collector resistance and maximum collector-base breakdown voltage since a higher dose results in a lower maximum collector-base breakdown voltage.

All the same, formation of p+/n junctions by ion implantation at an injection dopant dose around $1 \times 10^{14}$ cm$^{-2}$ and subsequent annealing by RTA (rapid thermal annealing) or an electric furnace under conditions of 10° C./sec or lower in terms of ramp-up rate is accompanied by a problem in that very large leakage currents occur across the junctions under the influence of defects extended to the surface of the sample from the neighborhood of the projection range of the ion implantation.

As a solution to this problem, Mat. Res. Soc. Symp. Proc. 396, 739 (1996, Materials Research Society) discloses that the leakage current across a junction can be reduced by RTA which makes use of a ramp-up rate of 50° C./sec or higher. It also discloses that, as the above-mentioned defects begin to grow abruptly when the temperature of RTA rises to 800° C., the leakage current can be reduced when the RTA is conducted by heating a wafer at a ramp-up rate of 50° C./sec or higher in the temperature range higher than or equal to 800° C. It is also disclosed that the leakage currents across the junctions of individual chips in a wafer can be lowered and their variations can be reduced to about half when RTA to a temperature of 1,050° C. is conducted by controlling the ramp-up rate at 1° C./sec from room temperature to 600° C. and at 100° C./sec beyond 600° C. instead of performing the heat treatment to the heat treatment temperature of 1,050° C. by using a ramp-up rate of 100° C./sec or higher from room temperature.

A ramp-up rate as low as 100° C./sec or so, however, involves a potential problem in that the above-described defects propagated from the projection range of ion implantation may grow to an area to which a depletion layer may extend upon application of a reverse bias. As soon as the depletion layer reaches a depth where defects exist, an increased leakage current occurs across the junction. According to the above-described conventional art, variations of leakage currents at a wafer surface may reach as much as 50% or so.

Namely, the process of the above-described conventional art is very effective in reducing the average value of leakage currents across junctions in a wafer, but further improvements are desired for the reduction of variations.

SUMMARY OF THE INVENTION

With the foregoing problems in view, the present invention has as a primary object thereof the provision of a process for the fabrication of semiconductors featuring both smaller leakage currents and reduced variations of the leakage currents even when ion implantation is conducted with high energy.

In a first aspect of the present invention, there is thus provided a fabrication process of semiconductor devices, which comprises the following steps:

subjecting a semiconductor substrate to ion implantation with high energy; and heating the resulting ion-implanted semiconductor substrate to a temperature of from 1,000° C. to 1,200° C. at a ramp-up rate equal to or higher than 200° C./sec.

In this process, the temperature at which the heating is initiated at the ramp-up rate equal to or higher than 200° C./sec may preferably be from 600° C. to 800° C.

In a second aspect of the present invention, there is also provided a fabrication process of semiconductor devices, which comprises the following steps:

subjecting a semiconductor substrate to ion implantation with high energy;

heating the resulting ion-implanted semiconductor substrate to a temperature of from 1,000° C. to 1,200° C. at a ramp-up rate equal to or higher than 50° C./sec; and subjecting the thus-heated semiconductor substrate to annealing at a temperature of from 1,000° C. to 1,200° C.

According to the first aspect of this invention, the heat treatment is conducted under hard conditions for the growth of defects occurred by the ion implantation so that, during the annealing step, the defects (dislocations) do not reach an area to which a depletion layer may extend. The process can therefore better reduce leakage currents and their variations than the conventional art. Further, the annealing at 1,200° C. and lower has made it possible to avoid the occurrence of slips (faults) in a wafer surface such as those occurring when the heat treatment is conducted at higher temperatures.

According to the second aspect of this invention, on the other hand, the ramp-up rate of 50° C./sec or higher is used, which includes ramp-up rates lower than those usable in the first aspect of the present invention. At such lower ramp-up rates, defects occurred as a result of the ion implantation may reach an area to which a depletion layer may extends. However, the subsequent heat treatment at a temperature of from 1,000° C. to 1,200° C. can eliminate the defects (dislocations) and restore the original crystalline structure, thereby making it possible to reduce leakage currents and their variations better than the conventional art.

DETAILED DESCRIPTION OF THE INVENTION

[First Embodiment]

The first embodiment will hereinafter be described based on a specific fabrication process according to the first aspect of the present invention.

Figure 1A:
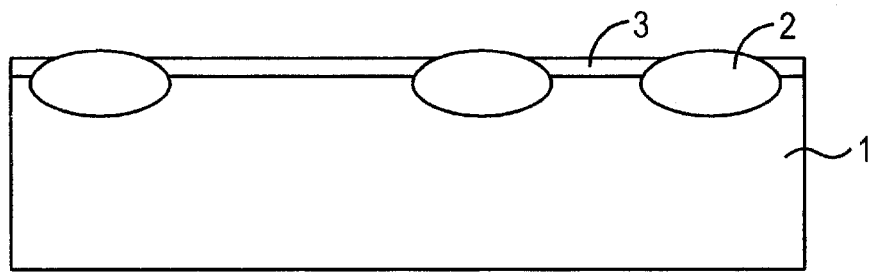
FIG. 1A through FIG. 1D are cross-sectional views of a substrate-illustrating the formation of p/n diodes at various stages according to one example of fabrication processes of the present invention.
Figure 1B:
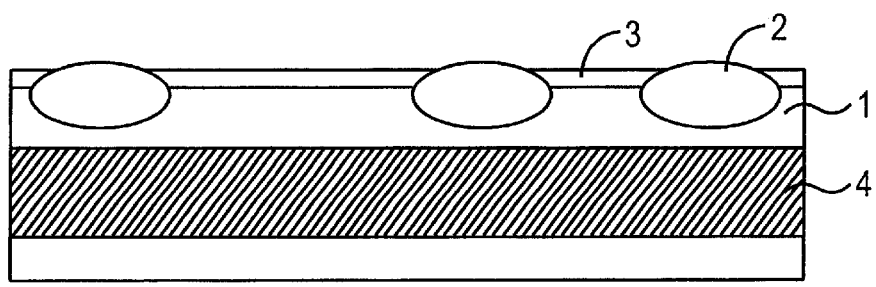

As is illustrated in FIG. 1A, a field oxide film 2 was first formed on a p-type single-crystal silicon substrate 1, followed by the formation of a silicon oxide film 3 to a thickness of 7 mm. P (phosphorus) ions were next implanted at an acceleration voltage of 1 MeV and a dose of $1 \times 10^{14}$ cm$^{-2}$. The resulting implanted substrate 1 was then annealed by RTA at a temperature of 1,150° C. by controlling the ramp-up temperature from room temperature at 100° C./sec (comparative example), 200° C./sec, 300° C./sec or 400° C./sec, whereby a buried n-type layer 4 was formed as shown in FIG. 1B.

Figure 1C:
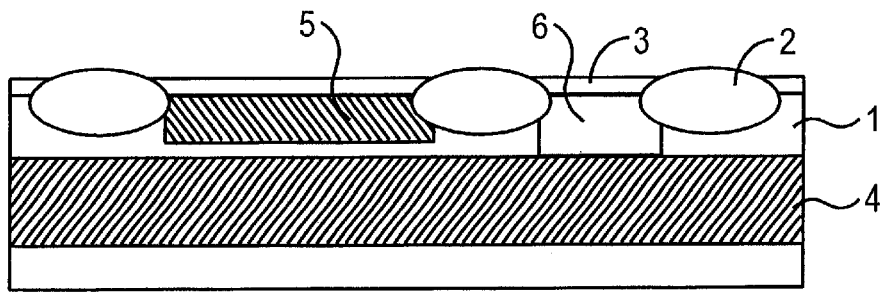

As is illustrated in FIG. 1C, ion implantation was then effected selectively at positions, where formation of p-type layers 5 was intended, at an acceleration voltage of 30 keV and a dose of $3 \times 10^{15}$ cm$^{-2}$ while using $BF_2$ as a dopant source. To establish a contact with the buried layer 4, P (phosphorus) was ion-implanted selectively at positions, where formation of contact layers 6 to the buried n-type layer 4 was intended, at 70 keV and $5 \times 10^{15}$ cm$^{-2}$ and at 250 keV and $3 \times 10^{13}$ cm$^{-2}$. The resulting substrate was subjected to heat treatment at 900° C. for several minutes in an electric furnace, so that the p-type layers 5 and the contact layers 6 were formed.

Subsequent to the formation of an interlayer film 7, openings were formed through the interlayer film 7 and the silicon oxide layer 3, and aluminum electrodes 8 and aluminum electrodes 9 were then formed in contact with the p-type layers 5 and the contact layers 6, respectively. As a result, p/n diodes each of which had a cross-sectional structure depicted in FIG. 1D were formed at 53 locations in the wafer surface.

Figure 2:
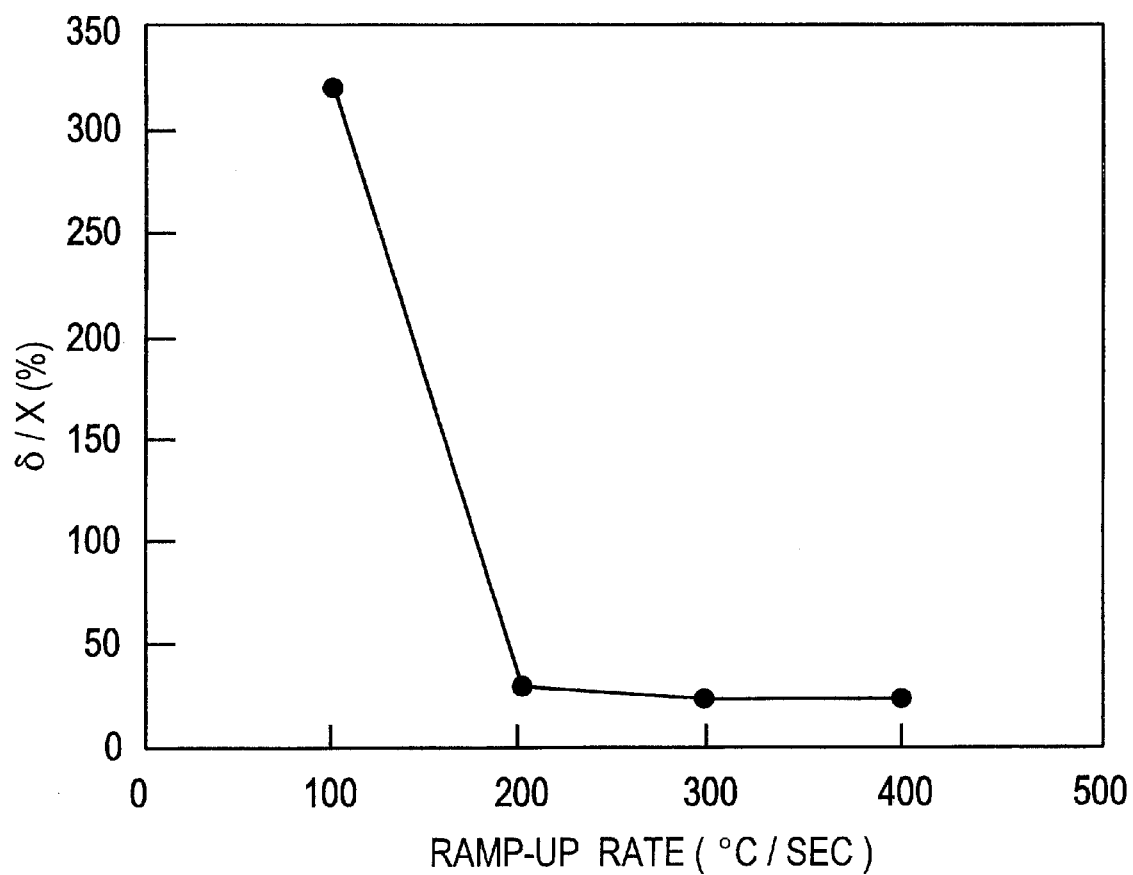
FIG. 2 is a diagrammatic representation of the ramp-up rate to an annealing temperature of 1,150° C. versus junction leakage current variation according to a first embodiment.

The p/n diodes fabricated as described above were grounded on a back side 10 of the substrate. A voltage of −5 V was applied to the aluminum electrodes 8, and leakage currents across the junctions were measured at the aluminum electrodes 9. An investigation was made for a relationship between variations (relative standard deviation: σ/X) of the thus-obtained leakage currents across the junctions in the wafer surface and the ramp-up rate. The results are shown in FIG. 2.

From the results, it has been found that upon formation of n-type buried layers, use of 200° C./sec or higher as a ramp-up rate to an annealing temperature of 1,150° C. can reduce the variations of leakage voltages across junctions to ¹⁄₁₀ or even smaller compared with 100° C./sec.

Next, the annealing temperature (ultimate temperature) upon formation of the buried n-type layer 4 was changed to 700, 800, 900, 985, 1,015, 1,100 and 1,150° C. to investigate their characteristics.

Figure 3:
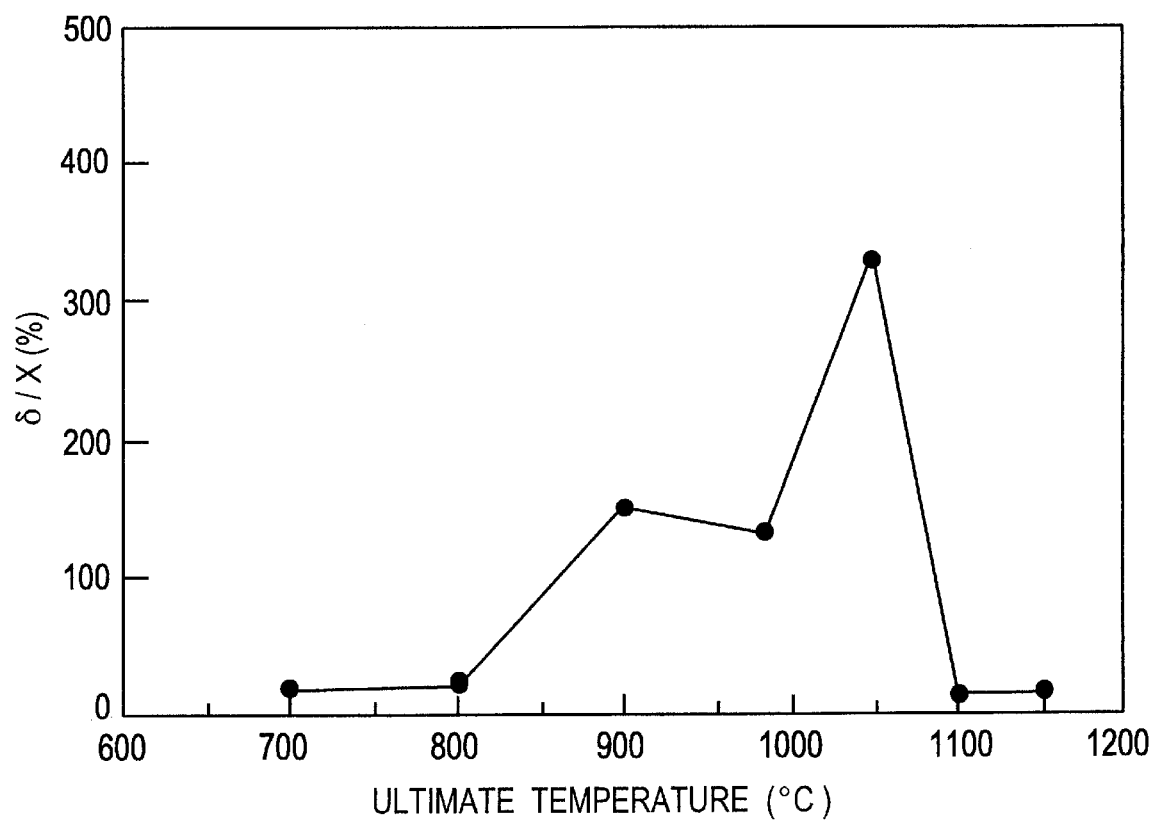
FIG. 3 is a diagrammatic representation of annealing temperature versus variations of junction leakage currents.
Figure 4:
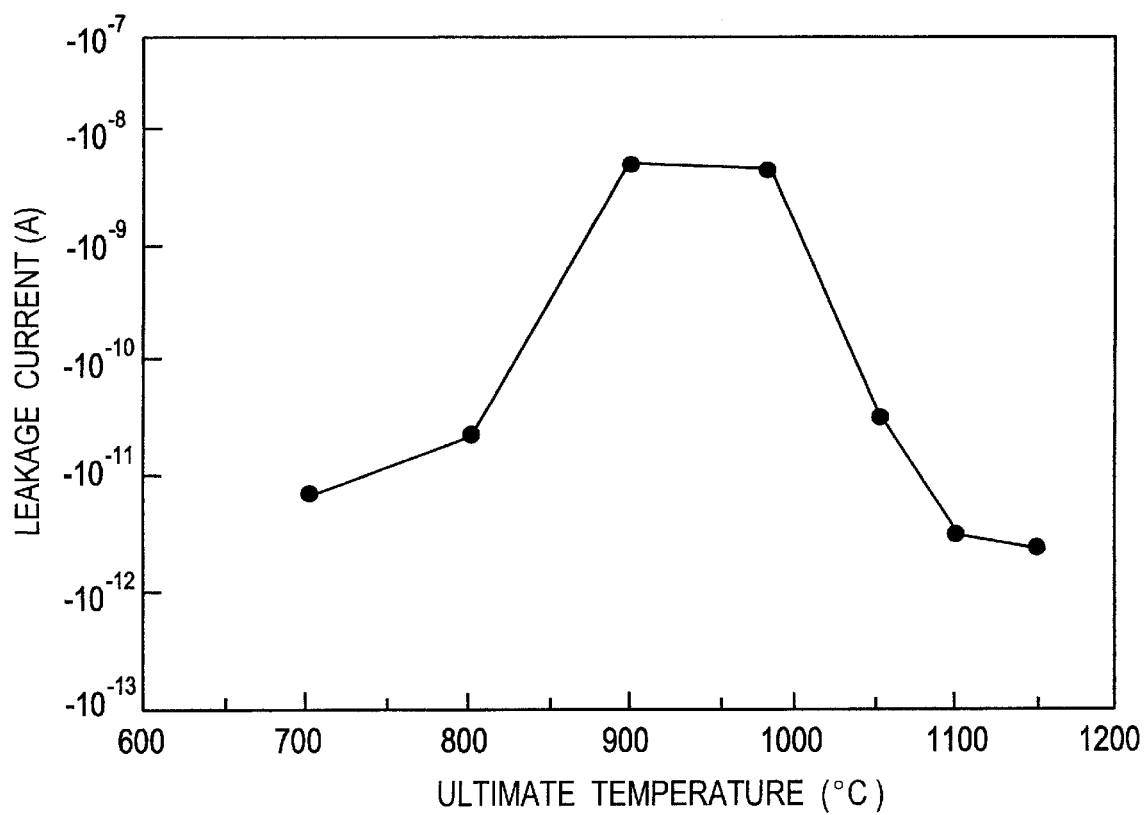
FIG. 4 is a diagrammatic representation of annealing temperature versus junction leakage currents.

As is illustrated in FIG. 3, it is appreciated that leakage currents have smaller variations when the heat treatment temperature (ultimate temperature) is 800° C. or lower or 1,100° C. or higher. From FIG. 4, on the other hand, it is also envisaged that leakage currents are small when the heat treatment temperature is 800° C. or lower or 1,000° C. or higher.

In view of these two results, 1,015° C. which is higher than 1,000° C. but exceeds 1,000° C. only a little seems to result in leakage voltages of large variations although the leakage voltages themselves are small. An investigation was therefore made for leakage characteristics of diodes fabricated at the heat treatment temperature of 1,015° C. Although most of them were found to have such characteristics as represented by curve A in FIG. 5, some devices were found to exhibit such characteristics as represented by curve B in the same diagram. This clearly explains the occurrence of large variations in terms of numerical values.

Figure 5:
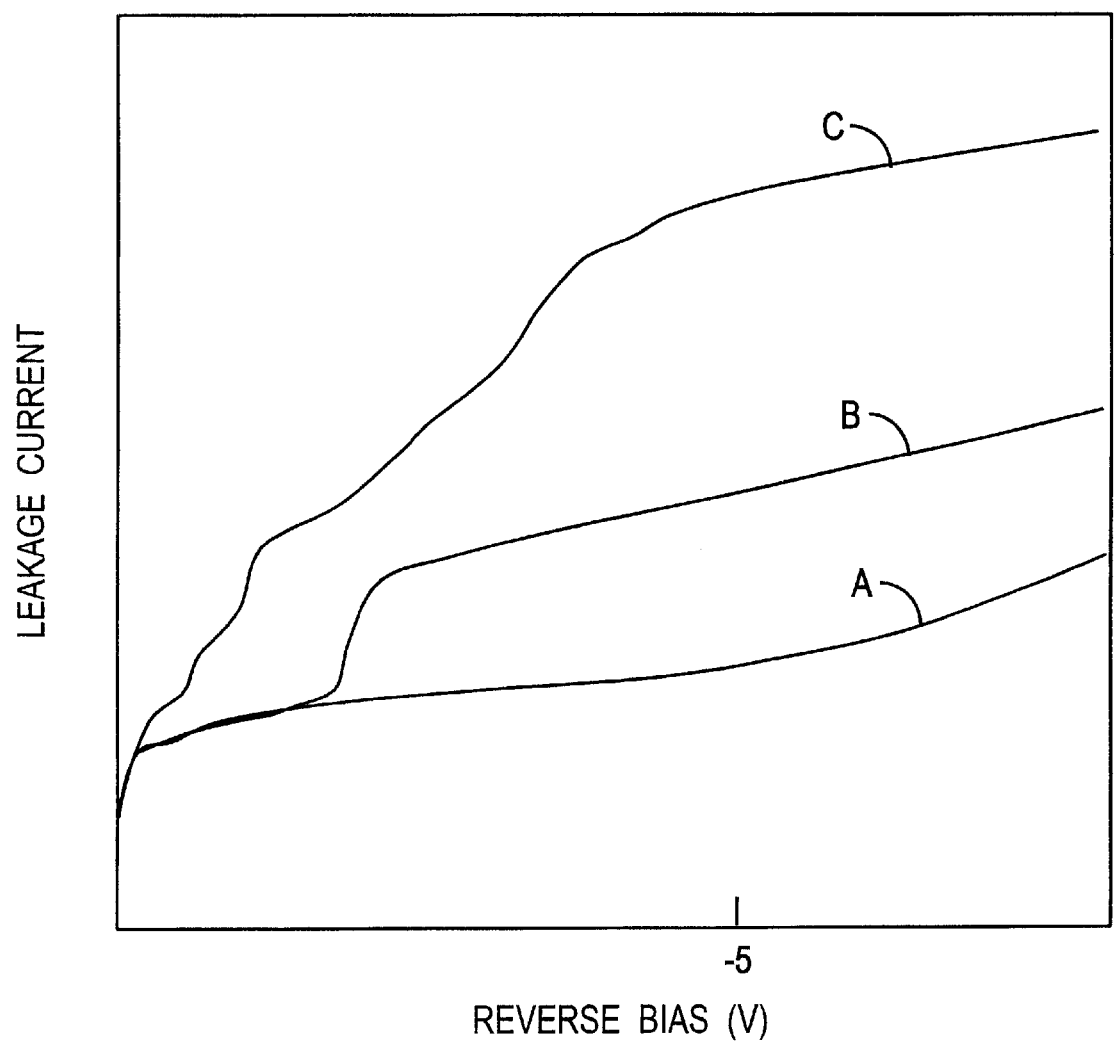
FIG. 5 is a diagram showing leakage characteristics.

On the other hand, use of a heat treatment temperature higher than 800° C. but lower than 1,000° C. leads to such leakage characteristics as indicated by curve C in FIG. 5. It is hence understood that such a heat treatment temperature is not preferred because it leads to large leakage voltages although their variations are apparently small.

Further, use of a heat treatment temperature of 800° C. or lower may look preferable at first view, because leakage currents are small and variations are small. Such a low heat treatment temperature is however not preferred from the practical viewpoint since, when exposed to high temperatures of 800° C. and higher in the subsequent step, defects (dislocations) occurred by the ion implantation grow and leakage currents increase.

[Second Embodiment]

Figure 1D:
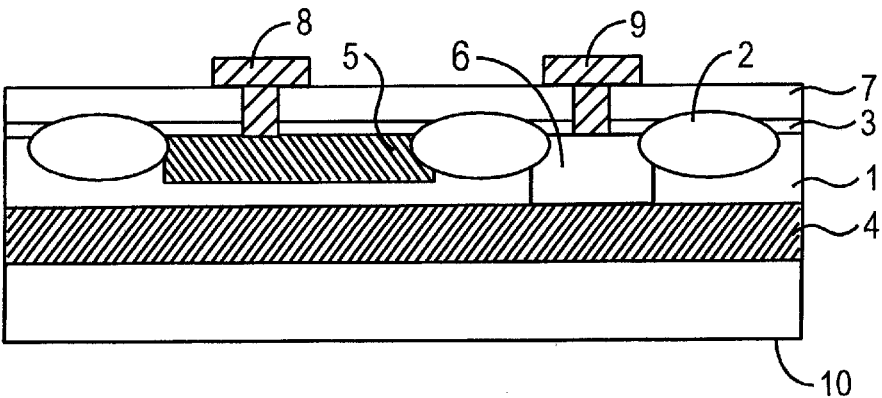

In a similar manner as in the fabrication process described above as the first embodiment, p/n diodes having the cross-sectional structure shown in FIG. 1D were formed at 53 locations in a wafer surface. In the second embodiment, however, the annealing method employed upon formation of the buried n-type layer 4 in FIG. 1B was modified as will be described next.

Described specifically, a sample was introduced in an RTA apparatus which had been heated at 500° C. in advance, and was heated to a first annealing temperature of 600° C., 700° C., 800° C, 900° C. (comparative example) or 1,000 (comparative example) while controlling the first ramp-up rate to the first treatment temperature at 1° C./sec. After the sample was annealed for 1 minute at the first annealing temperature, the sample was heated to a second annealing temperature of 1,150° C. at a second ramp-up rate of 200, 300 or 400° C./sec, whereby a buried n-type layer 4 was formed.

Figure 6:
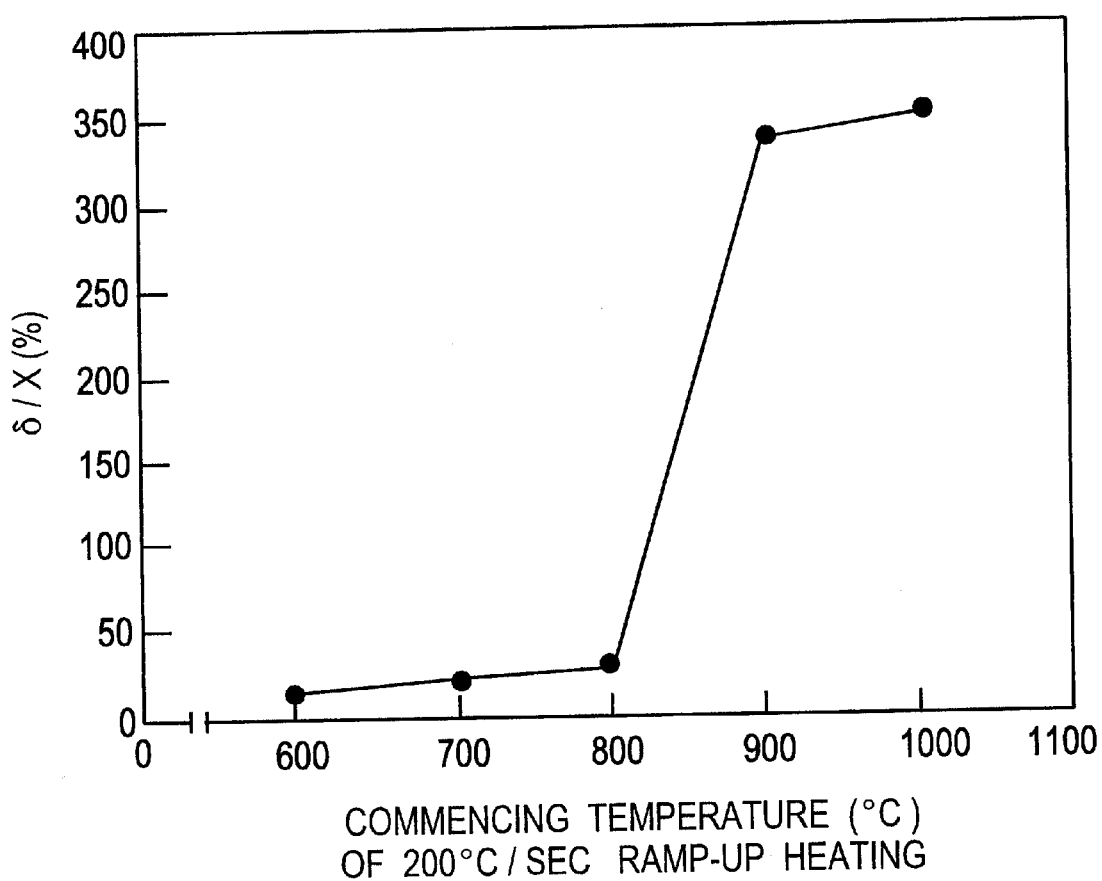
FIG. 6 is a diagrammatic representation of the heating commencing temperature in a second heat treatment step and variations of junction leakage current in a second embodiment.

FIG. 6 illustrates a relationship between the first annealing temperature, namely, the temperature at which heating was commenced at 200° C./sec and the variations (relative standard deviation) of leakage currents across junctions in a wafer surface.

From the results shown in FIG. 6, it is envisaged that the variations of junction leakage currents can be reduced when the 200° C./sec heating is commenced at a temperature of 800° C. or lower.

Figure 7:
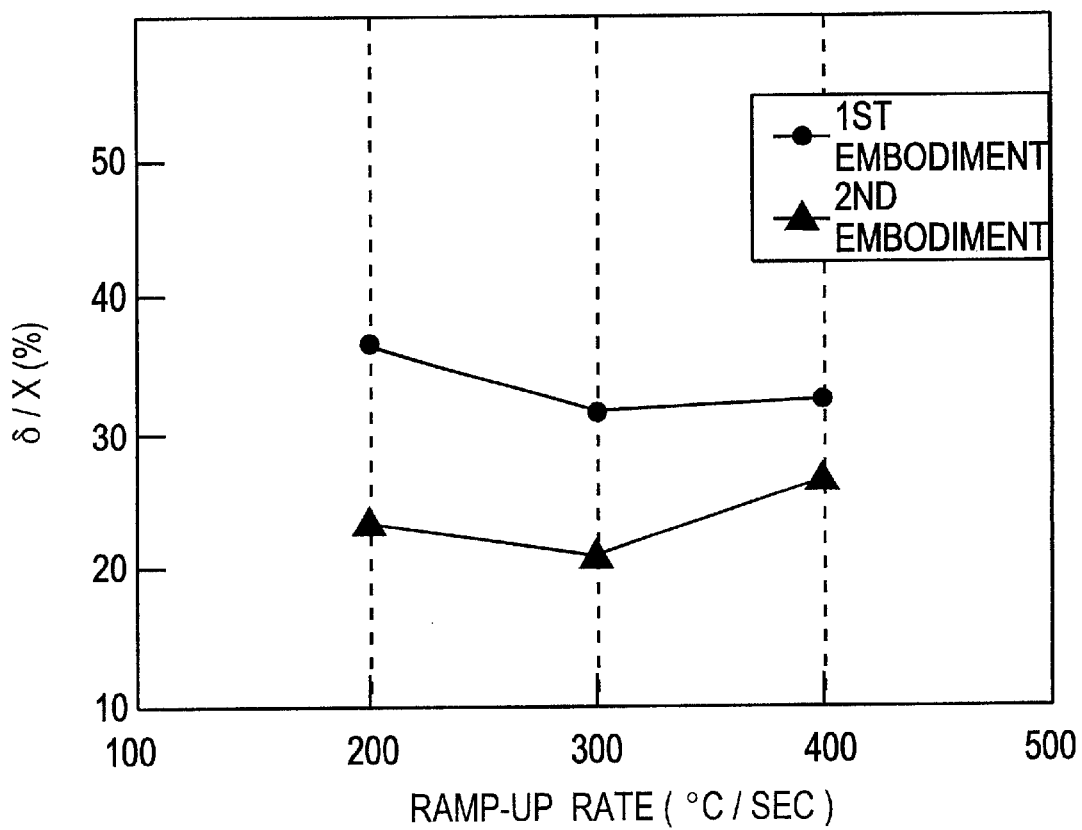
FIG. 7 is a diagram comparing the variations of junction leakage currents in the first embodiment and those in the second embodiment.

FIG. 7 makes a comparison in the variations (relative standard deviation) of junction leakage currents in a wafer surface between a case in which in accordance with this embodiment, a sample was introduced in an RTA apparatus heated at 500° C. in advance, was heated to a first annealing temperature of 600° C. at a ramp-up rate of 1° C./sec, and was then heated at a second ramp-up rate of 200, 300 or 400° C./sec to conduct heat treatment at a second heat treatment of 1,150° C. (the line representing the second embodiment in FIG. 7) and another case in which as in the first embodiment, heating of a sample was commenced at a ramp-up rate of 200–400° C./sec from room temperature and annealing was conducted at an annealing temperature of 1,150° C. (the line representing the first embodiment in FIG. 7).

From the results of the above comparison, it is understood that the use of the annealing method according to this embodiment, at any ramp-up rate chosen here, makes it possible to reduce the variations of leakage currents across junctions in a wafer surface to about ½ of those obtained from the use of the annealing method in the first embodiment.

In the above description of the second embodiment, 1° C./sec was used as the first ramp-up rate. The first ramp-up rate is however not particularly important, but annealing at a temperature of from 600° C. to 800° C. as the first annealing temperature is important. It is to equalize the temperature of the whole substrate at this stage to prevent the variations of substrate temperatures from increasing further upon subsequently heating the substrate at a high ramp-up rate that the first heat treatment is conducted. Further, the use of 600° C. or higher as the first heat treatment temperature is needed because the equalizing effects of a substrate temperature by black body radiation are hardly available at a temperature lower than 600° C.

Incidentally, the retention time at the first heat temperature can be set as desired to equalize the substrate temperature.

[Third Embodiment]

The third embodiment will hereinafter be described based on a specific fabrication process according to the second aspect of the present invention.

In a similar manner as in the fabrication process described above as the first embodiment, p/n diodes having the cross-sectional structure shown in FIG. 1D were formed at 53 locations in a wafer surface. In the third embodiment, however, the annealing method employed upon formation of the buried n-type layer 4 in FIG. 1B was modified as will be described next.

Described specifically, as a first annealing step, a sample was introduced in an RTA apparatus which had been heated at 500° C. in advance, and was heated at a ramp-up rate of 1° C./sec to a heat treatment temperature of 600° C., at which the sample was annealed for 1 minute. The sample was then heated at a ramp-up rate of 50 or 100° C./sec to an annealing temperature of 1,015° C. or 1,100° C., at which the sample was subjected to heat temperature for 30 seconds.

Next, as a second annealing step, the sample was introduced in an electric furnace and was subjected to annealing for one of preset various annealing times at an annealing temperature in a range of from 1,015° C. to 1,200° C. with its furnace entering and leaving temperatures being set at 800° C., whereby a buried n-type layer 4 was formed.

Figure 8:
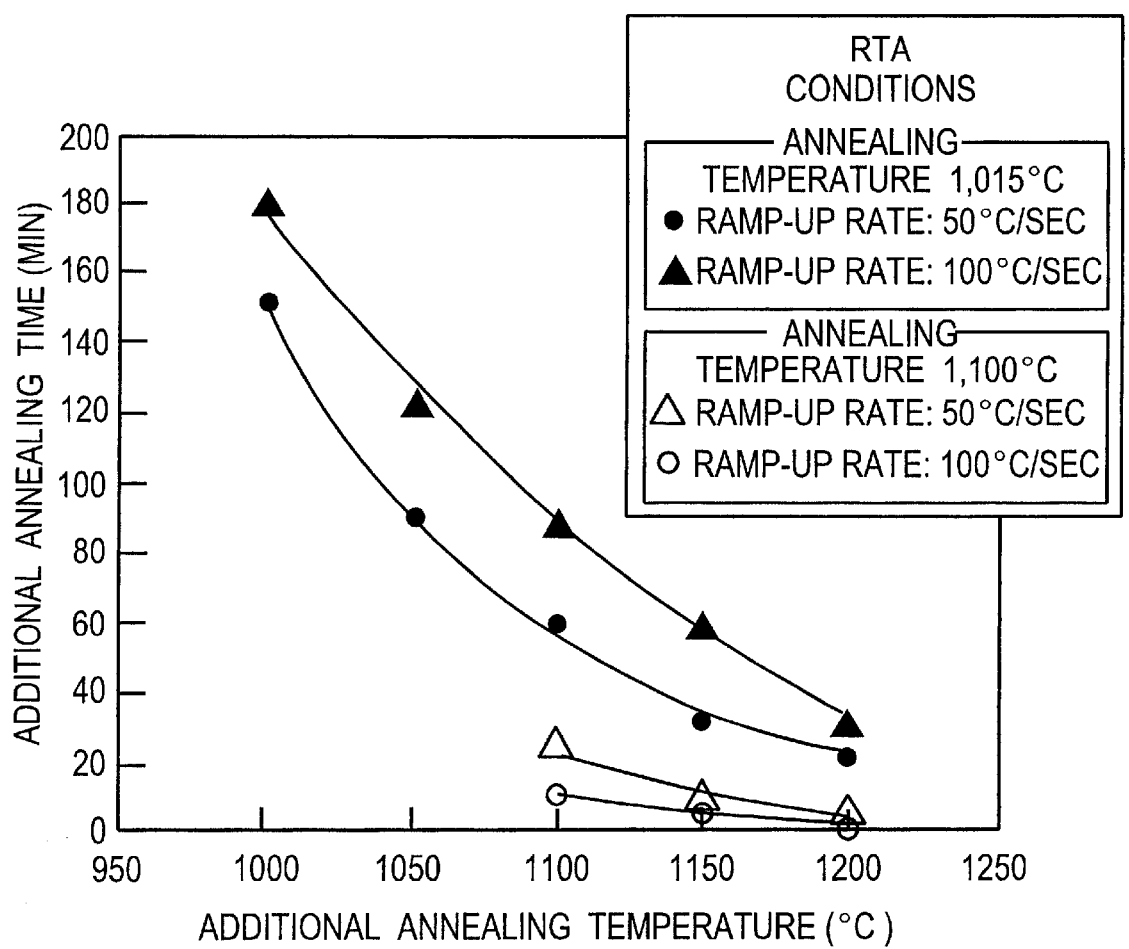
FIG. 8 is a diagram illustrating a second (additional) heat treatment temperature and time in a third embodiment, which control at 20% the variations of junction leakage currents.

FIG. 8 illustrates a relationship between the annealing temperature and the annealing time in the second annealing (additional annealing) conducted in an electric furnace so that the variations (relative standard deviation) of leakage currents across junctions in a wafer surface became 20%. When the annealing temperature and the ramp-up rate are set, for example, at 1,015° C. and 100° C./sec as RTA treatment conditions, respectively, FIG. 8 indicates that the variations are smaller than 20% above the curve extending through the filled circles. To reduce the variations to 20% or smaller, it is therefore necessary to choose an additional annealing temperature and an additional annealing time on the curve or in an area above the curve.

It is envisaged from the results as shown in FIG. 8 that the variations of leakage currents can be reduced by conducting the second annealing as described above. Further, it is appreciated that the time required for reducing the variations in the second annealing becomes longer when the annealing temperature is lowered and also that the time required for reducing the variations can be shortened by raising the heat treatment temperature. It is also understood that the variations can be reduced to 20% or smaller even when the ramp-up rate is decreased to 50° C./sec.

On the other hand, it was impossible to reduce the variations when the temperature of the second annealing was set below 1,000° C. Further, the second heat treatment, when conducted at a temperature higher than 1,200° C., has been found to develop a problem that crystal defects such as slips occur in the crystal.

As has been described above, the ramp-up rate can be decreased to 50° C./sec upon conducting the second annealing. On the other hand, the second annealing has also been found to be effective in reducing the variations even when a high ramp-up rate of 200° C./sec or higher is used. In this case, the second annealing can be conducted in the same RTA apparatus as that employed in the preceding heating step. Similar advantageous effects were brought about when the second annealing was conducted, for example, in a temperature range of from 1,000 to 1,200° C. subsequent to heating to 1,150° C.

As is readily appreciated from the foregoing, the second annealing step can bring about similar advantageous effects no matter whether it is conducted in an RTA apparatus or an electric furnace. In general, however, an RTA apparatus treats semiconductor substrates one after one, whereas an electric furnace can perform heat treatment of plural (about 100 or so) semiconductor substrates at once. Accordingly, an electric furnace can significantly shorten the total time required for the heat treatment of such many semiconductor substrates.

Namely, this embodiment, when the additional annealing is conducted separately, makes it possible to use a heating furnace having large processing capacity such as an electric furnace and hence to extremely shorten the fabrication time.

According to the fabrication process in each aspect of the present invention, defects which cause varied leakage currents across junctions are not allowed to grow to an area where a depletion layer extends even when ion implantation is conducted with high energy, thereby making it possible to fabricate semiconductors featuring both smaller leakage currents and reduced variations of the leakage currents.

What is claimed is:

1. A fabrication process of semiconductor devices featuring both reduced leakage currents and reduced variations of leakage currents, which comprises the steps in sequence of:

(A) subjecting a semiconductor substrate to ion implantation with high energy;

(B) introducing the resulting ion-implanted semiconductor substrate into a first furnace preheated to a temperature of 500° C. and subjecting the substrate to annealing at a temperature selected from the group of temperatures consisting of 1015° C., 1100° C., and 1150° C.; and (C) introducing the resulting semiconductor substrate from step (B) into a second furnace, and heating the substrate in said second furnace to a temperature of from 1,000° C. to 1,200° C. at a ramp-up rate equal to or higher than 300° C./sec.

2. A fabrication process according to claim 1, further comprising annealing said semiconductor substrate in said second furnace at said temperature of from 1,000° C. to 1,200° C. for thirty seconds.

3. A fabrication process according to claim 2, wherein said second furnace comprises an electric furnace.

4. A fabrication process of semiconductor devices featuring both reduced leakage currents and reduced variations of leakage currents, which comprises the following steps in sequence of:

(A) subjecting a semiconductor substrate to ion implantation with high energy;

(B) introducing the resulting ion-implanted semiconductor substrate into a first furnace preheated to a temperature of at least 500° C. and heating the substrate at a ramp-up rate of 1° C./sec to a temperature of 600° C.;

(C) introducing the semiconductor substrate from step (B) into a second furnace with its entering and exiting temperatures set at 800° C., and heating the substrate to a temperature of from 1,000° C. to 1,200° C. at a ramp-up rate equal to 50° C./sec; and (D) subjecting the thus-heated semiconductor substrate to annealing at a temperature of from 1,000° C. to 1,200° C.

5. A fabrication process according to claim 4, wherein said second furnace comprises an electric furnace.

* * * * *